United States Patent
Hu et al.

(10) Patent No.: US 9,166,114 B2
(45) Date of Patent: Oct. 20, 2015

(54) STABILIZATION STRUCTURE INCLUDING SACRIFICIAL RELEASE LAYER AND STAGING CAVITY

(71) Applicant: LUXVUE TECHNOLOGY CORPORATION, Santa Clara, CA (US)

(72) Inventors: Hsin-Hua Hu, Los Altos, CA (US); Andreas Bibl, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 0 days.

(21) Appl. No.: 13/754,717

(22) Filed: Jan. 30, 2013

(65) Prior Publication Data

US 2014/0159065 A1    Jun. 12, 2014

Related U.S. Application Data

(60) Provisional application No. 61/735,958, filed on Dec. 11, 2012.

(51) Int. Cl.
| | | |
|---|---|---|
| *H01L 27/15* | (2006.01) | |
| *H01L 21/58* | (2006.01) | |
| *H01L 33/48* | (2010.01) | |
| *H01L 33/00* | (2010.01) | |
| *B81C 99/00* | (2010.01) | |
| *H01L 25/075* | (2006.01) | |

(52) U.S. Cl.
CPC ............. *H01L 33/48* (2013.01); *B81C 99/002* (2013.01); *H01L 21/58* (2013.01); *H01L 27/156* (2013.01); *H01L 33/0079* (2013.01); *H01L 25/0753* (2013.01); *H01L 27/153* (2013.01); *H01L 2224/16225* (2013.01); *H01L 2924/1461* (2013.01)

(58) Field of Classification Search
None
See application file for complete search history.

(56) References Cited

U.S. PATENT DOCUMENTS

| | | |
|---|---|---|
| 5,592,358 A | 1/1997 | Shamouilian et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,319,778 B1 | 11/2001 | Chen et al. |
| 6,335,263 B1 | 1/2002 | Cheung et al. |
| 6,403,985 B1 | 6/2002 | Fan et al. |

(Continued)

FOREIGN PATENT DOCUMENTS

| | | |
|---|---|---|
| JP | 3406207 | 5/1999 |
| WO | WO 2011/123285 | 10/2011 |

OTHER PUBLICATIONS

"Cyclotene Advanced Electronic Resins—Processing Procedures for BCB Adhesion," The Dow Chemical Company, Revised Jun. 2007, pp. 1-10.

(Continued)

*Primary Examiner* — Johannes P Mondt
(74) *Attorney, Agent, or Firm* — Blakely, Sokoloff, Taylor & Zafman LLP

(57) ABSTRACT

A method and structure for stabilizing an array of micro devices is disclosed. The array of micro devices is held within an array of staging cavities on a carrier substrate. Each micro device is laterally surrounded by sidewalls of a corresponding staging cavity.

20 Claims, 19 Drawing Sheets

(56) References Cited

U.S. PATENT DOCUMENTS

| | | | |
|---|---|---|---|
| 6,410,942 B1 * | 6/2002 | Thibeault et al. | 257/88 |
| 6,420,242 B1 | 7/2002 | Cheung et al. | |
| 6,521,511 B1 | 2/2003 | Inoue et al. | |
| 6,558,109 B2 | 5/2003 | Gibbel | |
| 6,586,875 B1 | 7/2003 | Chen et al. | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,677,225 B1 * | 1/2004 | Ellis et al. | 438/598 |
| 6,762,069 B2 | 7/2004 | Huang et al. | |
| 6,786,390 B2 | 9/2004 | Yang et al. | |
| 6,878,607 B2 | 4/2005 | Inoue et al. | |
| 7,015,513 B2 | 3/2006 | Hsieh | |
| 7,033,842 B2 | 4/2006 | Haji et al. | |
| 7,148,127 B2 | 12/2006 | Oohata et al. | |
| 7,208,337 B2 | 4/2007 | Eisert et al. | |
| 7,353,596 B2 | 4/2008 | Shida et al. | |
| 7,358,158 B2 | 4/2008 | Aihara et al. | |
| 7,560,738 B2 | 7/2009 | Liu | |
| 7,585,703 B2 | 9/2009 | Matsumura et al. | |
| 7,622,367 B1 | 11/2009 | Nuzzo et al. | |
| 7,723,764 B2 | 5/2010 | Oohata et al. | |
| 7,795,629 B2 | 9/2010 | Watanabe et al. | |
| 7,797,820 B2 | 9/2010 | Shida et al. | |
| 7,838,410 B2 | 11/2010 | Hirao et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,972,875 B2 * | 7/2011 | Rogers et al. | 438/21 |
| 7,999,454 B2 | 8/2011 | Winters et al. | |
| 8,023,248 B2 | 9/2011 | Yonekura et al. | |
| 8,333,860 B1 | 12/2012 | Bibl et al. | |
| 8,349,116 B1 | 1/2013 | Bibl et al. | |
| 8,440,546 B2 | 5/2013 | Nuzzo et al. | |
| 8,506,867 B2 | 8/2013 | Menard | |
| 8,664,699 B2 | 3/2014 | Nuzzo et al. | |
| 8,865,489 B2 | 10/2014 | Rogers et al. | |
| 8,877,648 B2 | 11/2014 | Bower et al. | |
| 8,889,485 B2 | 11/2014 | Bower | |
| 8,934,259 B2 | 1/2015 | Bower et al. | |
| 2001/0029088 A1 | 10/2001 | Odajima et al. | |
| 2002/0076848 A1 | 6/2002 | Spooner et al. | |
| 2003/0177633 A1 | 9/2003 | Haji et al. | |
| 2006/0157721 A1 * | 7/2006 | Tran et al. | 257/98 |
| 2007/0131950 A1 * | 6/2007 | Takeuchi | 257/93 |
| 2007/0166851 A1 * | 7/2007 | Tran et al. | 438/22 |
| 2008/0163481 A1 | 7/2008 | Shida et al. | |
| 2008/0315236 A1 | 12/2008 | Lu et al. | |
| 2009/0068774 A1 | 3/2009 | Slater et al. | |
| 2009/0202197 A1 * | 8/2009 | Heinz-Gunter | 385/14 |
| 2009/0314991 A1 | 12/2009 | Cho et al. | |
| 2010/0078656 A1 * | 4/2010 | Seo et al. | 257/88 |
| 2010/0171094 A1 | 7/2010 | Lu et al. | |
| 2010/0188794 A1 | 7/2010 | Park et al. | |
| 2010/0203661 A1 | 8/2010 | Hodota | |
| 2010/0244077 A1 | 9/2010 | Yao | |
| 2010/0248484 A1 | 9/2010 | Bower et al. | |
| 2011/0003410 A1 * | 1/2011 | Tsay et al. | 438/27 |
| 2011/0136324 A1 * | 6/2011 | Ashdown et al. | 438/464 |
| 2012/0064642 A1 | 3/2012 | Huang et al. | |
| 2012/0134065 A1 | 5/2012 | Furuya et al. | |
| 2014/0159066 A1 | 6/2014 | Hu et al. | |
| 2014/0373898 A1 | 12/2014 | Rogers et al. | |

OTHER PUBLICATIONS

Niklaus, et al., "Low-temperature full wafer adhesive bonding," Institute of Physics Bonding, Journal of Micromechanics and Microengineering, vol. 11, 2001, pp. 100-107.

Wohrmann, et al., "Low Temperature Cure of BCB and the Influence on the Mechanical Stress," 2011 Electronic Components and Technology Conference, pp. 392-400.

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, SanYoul, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

Overstolz, et al., "A Clean Wafer-Scale Chip-Release Process without Dicing Based on Vapor Phase Etching," Presented at the 17th IEEE International Conference on Micro Electro Mechanical Systems, Jan. 25-29, 2004, Maaastricht, The Netherlands. Published in the Technical Digest, ISBN 0-7803-8265-X, pp. 717-720, 4 pgs.

* cited by examiner

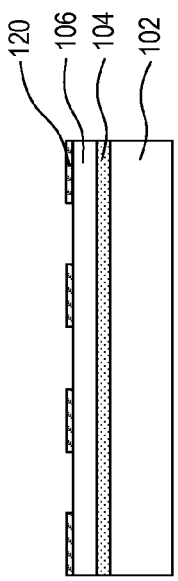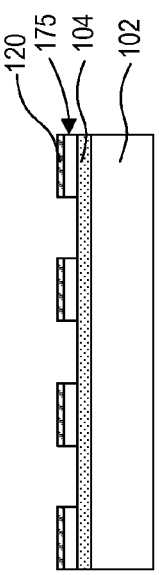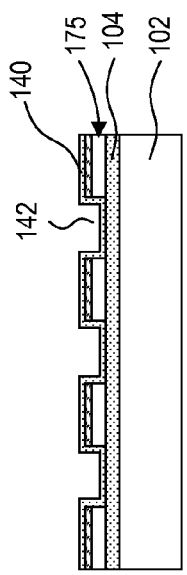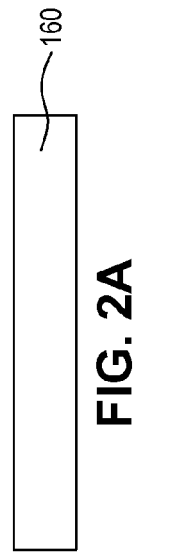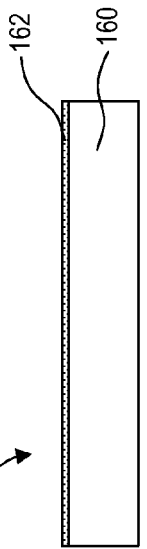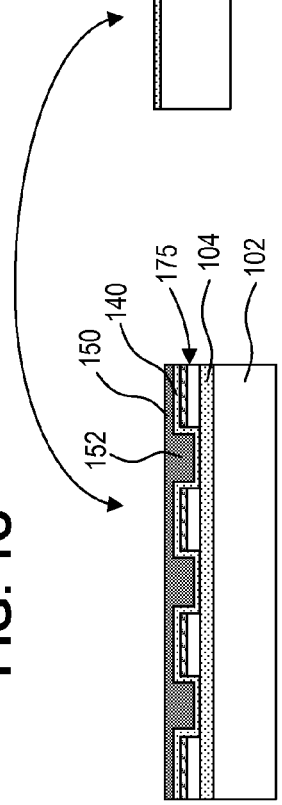

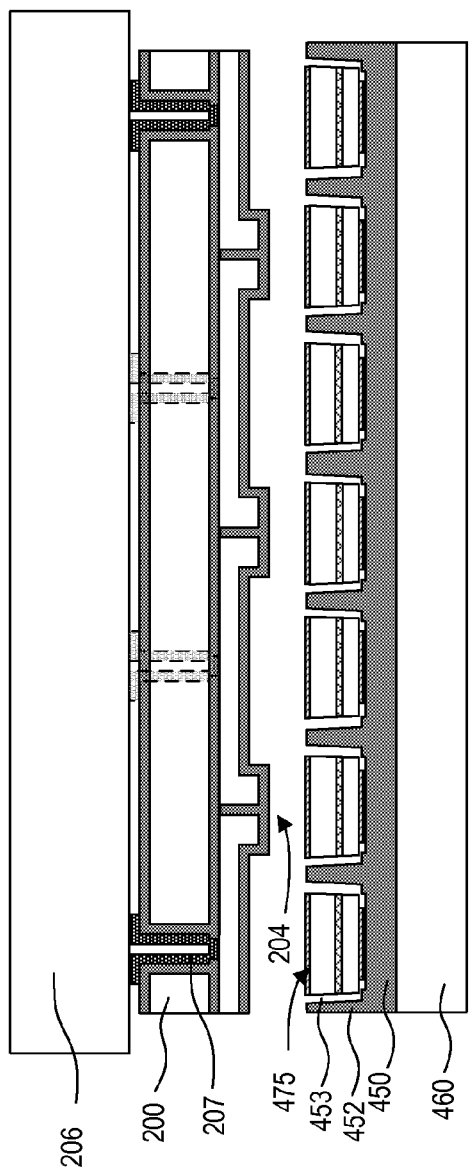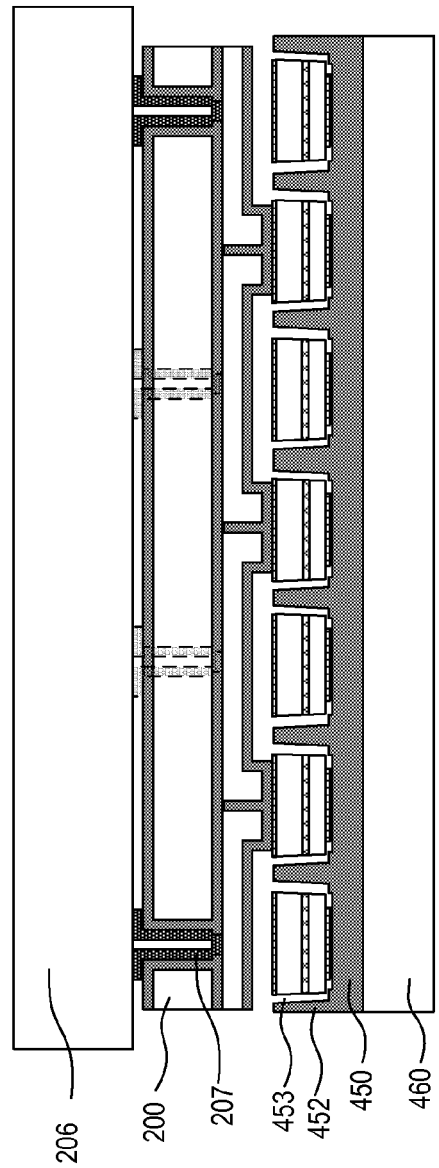
FIG. 6A
FIG. 6B

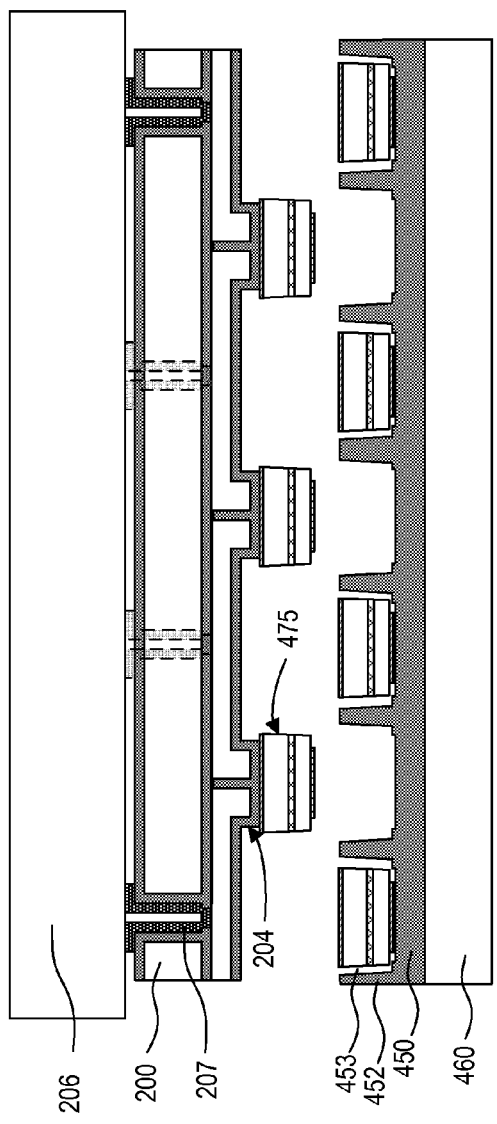
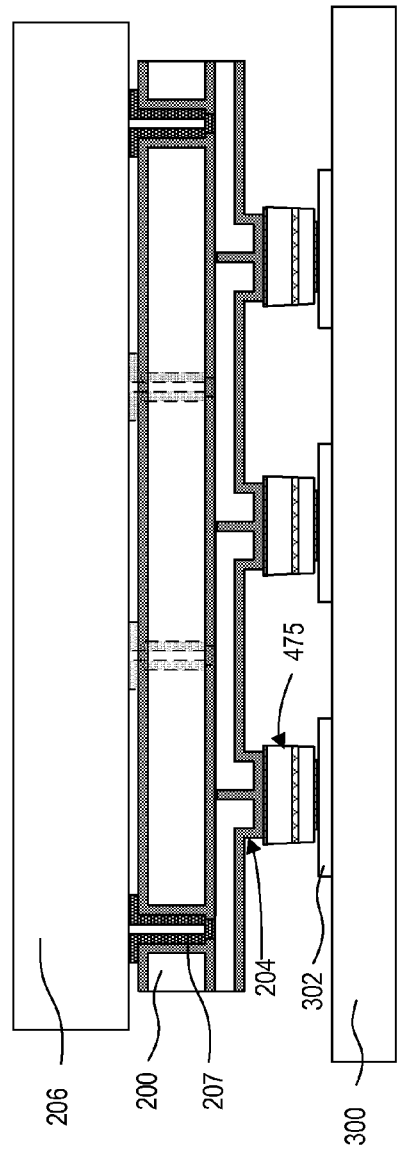

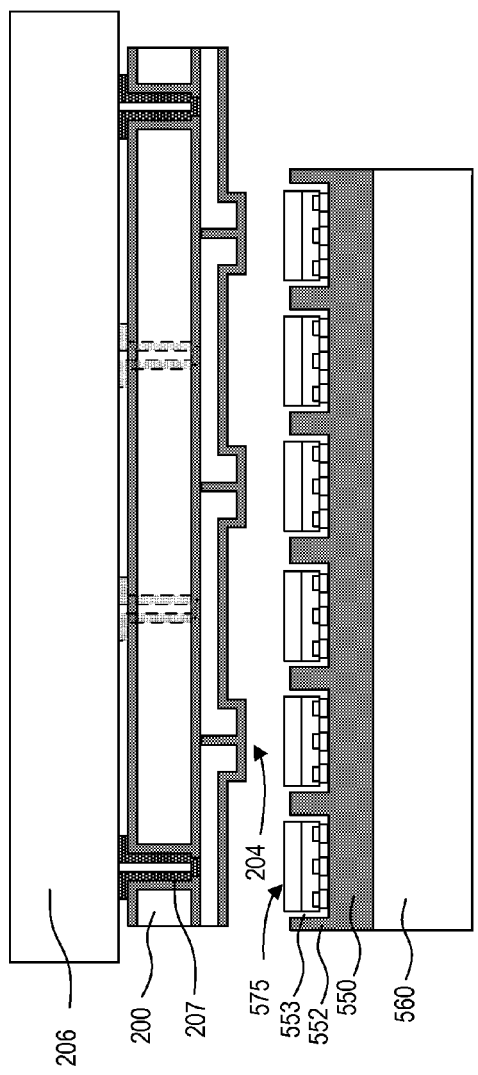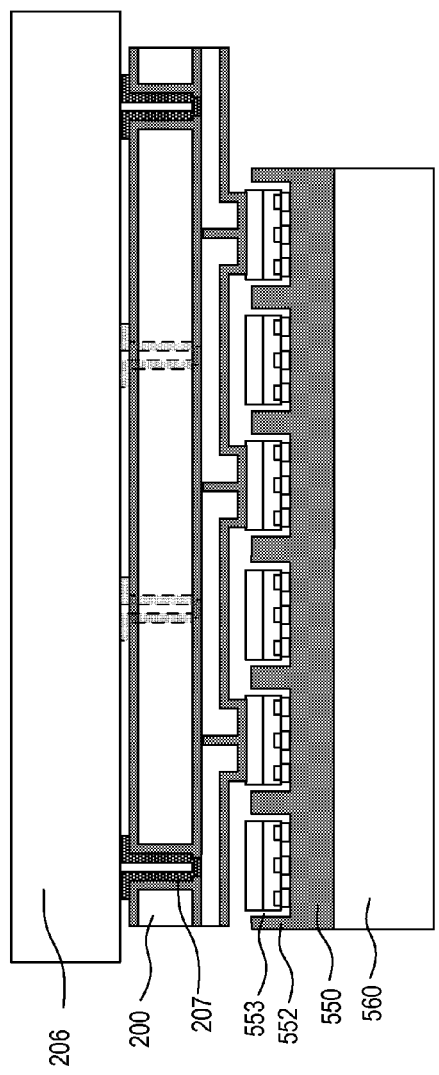
FIG. 8A
FIG. 8B

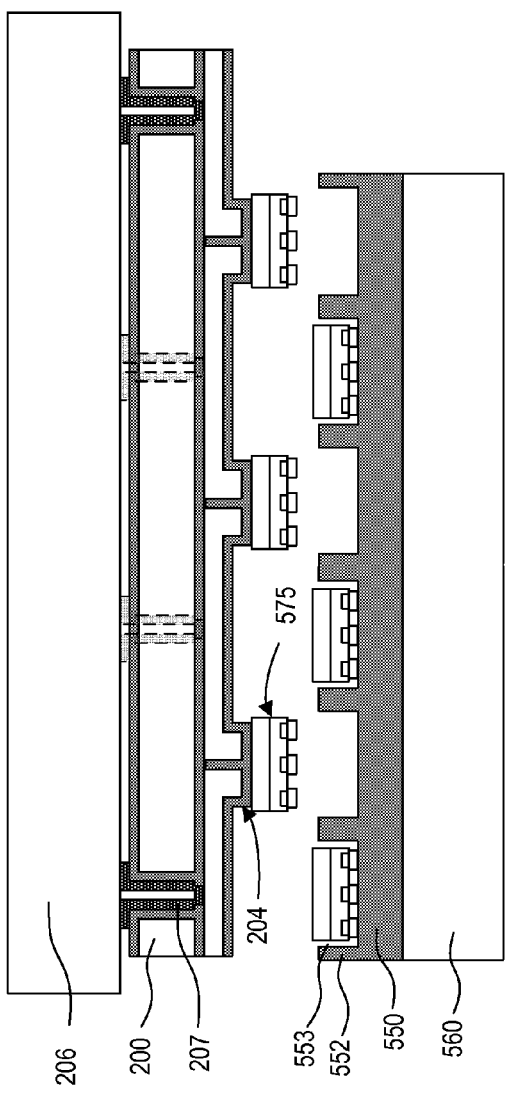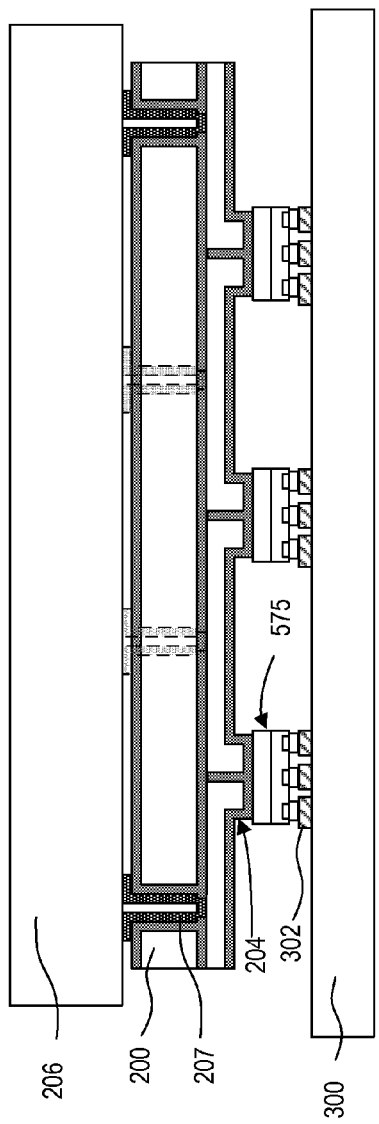

STABILIZATION STRUCTURE INCLUDING SACRIFICIAL RELEASE LAYER AND STAGING CAVITY

RELATED APPLICATIONS

This application claims the benefit of priority from U.S. Provisional Patent Application Ser. No. 61/735,958 filed on Dec. 11, 2012.

BACKGROUND

1. Field

The present invention relates to micro devices. More particularly embodiments of the present invention relate to the stabilization of micro devices on a carrier substrate.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

BRIEF DESCRIPTION OF THE DRAWINGS

FIGS. 1A-1D are cross-sectional side view illustrations of forming an array of micro devices over a handle substrate in accordance with an embodiment of the invention.

FIGS. 2A-2B are cross-sectional side view illustrations of a carrier substrate in accordance with an embodiment of the invention.

FIGS. 6A-6E are cross-sectional side view illustrations for a method of transferring an array of micro LED devices from a carrier substrate to a receiving substrate in accordance with embodiments of the invention.

FIGS. 8A-8E are cross-sectional side view illustrations for a method of transferring an array of micro chips from a carrier substrate to a receiving substrate in accordance with embodiments of the invention.

DETAILED DESCRIPTION OF THE INVENTION

Figure 3A:
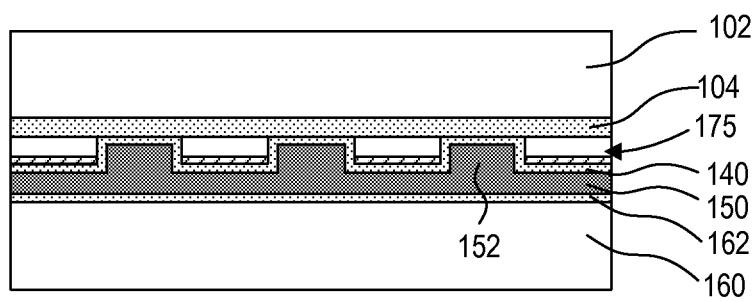
FIG. 3A is a cross-sectional side view illustration of a handle substrate bonded to a carrier substrate in accordance with an embodiment of the invention.

Embodiments of the present invention describe a method and structure for stabilizing an array of micro devices such as micro light emitting diode (LED) devices and micro chips on a carrier substrate so that they are poised for pick up and transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments some of the present invention are described with specific regard to micro LED devices comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser). Other embodiments of the present invention are described with specific regard to micro chips including circuitry. For example, the micro chips may be based on silicon or SOI wafers for logic or memory applications, or based on GaAs wafers for RF communications applications.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment,"

"an embodiment" or the like in various places throughout this specification are not necessarily referring to the same embodiment of the invention. Furthermore, the particular features, structures, configurations, or characteristics may be combined in any suitable manner in one or more embodiments.

The terms "over", "spanning", "to", "between", and "on" as used herein may refer to a relative position of one layer with respect to other layers. One layer "over", "spanning", or "on" another layer or bonded "to" another layer may be directly in contact with the other layer or may have one or more intervening layers. One layer "between" layers may be directly in contact with the layers or may have one or more intervening layers.

The terms "micro" device, "micro" chip, or "micro" LED device as used herein may refer to the descriptive size of certain devices, chips, or structures in accordance with embodiments of the invention. As used herein the term "micro device" specifically includes, but is not limited to, "micro LED device" and "micro chip". As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 μm. In an embodiment, the top contact surface of each micro device or electrostatic transfer head has a maximum dimension of 1 to 100 μm, or more specifically 3 to 20 μm. In an embodiment, a pitch of an array of micro devices, and a corresponding array of electrostatic transfer heads is (1 to 100 μm) by (1 to 100 μm), for example a 20 μm by 20 μm pitch or 5 μm by 5 μm pitch.

In one aspect, embodiments of the invention describe a structure for stabilizing an array of micro devices on a carrier substrate so that they are poised for pick up and transfer to a receiving substrate. In an embodiment, an array of micro devices are held within a corresponding array of staging cavities in which each micro device is laterally surrounded by sidewalls of a corresponding staging cavity. In an embodiment, each micro device is embedded in a sacrificial release layer within the array of staging cavities. When the array of micro devices are embedded within the sacrificial release layer the structure may be durable for handling and cleaning operations to prepare the structure for subsequent sacrificial release layer removal and electrostatic pick up.

Without being limited to a particular theory, embodiments of the invention utilize transfer heads and head arrays which operate in accordance with principles of electrostatic grippers, using the attraction of opposite charges to pick up micro devices. In accordance with embodiments of the present invention, a pull-in voltage is applied to a transfer head in order to generate a grip pressure on a micro device and pick up the micro device.

Upon removal of the sacrificial release layer the array of micro devices may drop into the staging cavities due to removal of the sacrificial release layer spanning underneath the entire bottom surface of the device layer below the array of micro devices This may significantly reduce the adhesion of the array micro devices to the support structure. In accordance with embodiments of the invention, adhesion between the staging cavity and the micro device after removal of the sacrificial release layer is less than adhesion between the micro device and the sacrificial release layer. In an embodiment, covalent bonds between a deposited sacrificial release layer and micro device may be removed, for example, covalent bonds associated with chemical vapor deposition (CVD). Accordingly, removal of the sacrificial release layer may remove adhesive forces resulting from layer on layer deposition. Furthermore, the array of micro devices are laterally restrained within the array of staging cavities after removal of the sacrificial release layer. In this manner, the array of micro devices are poised for pick up with lower required pick up pressure, and the array of staging cavities ensures proper spacing of the array of micro devices for pick up.

In another aspect, embodiments of the invention describe a manner of forming an array of micro devices which are poised for pick up in which conductive contact layers can be formed on top and bottom surfaces of the micro devices, and annealed to provide ohmic contacts. Where a conductive contact is formed on a top surface of a micro device, a stabilization layer forming the array of staging cavities may be constructed of a material which is capable of withstanding the associated deposition and annealing temperatures. For example, a conductive contact may require annealing at temperatures between 200° C. to 350° C. to form an ohmic contact with the micro device. In this manner, embodiments of the invention may be utilized to form arrays of micro LED devices based upon a variety of different semiconductor compositions for emitting various different visible wavelengths. For example, micro LED growth substrates including active devices layers formed of different materials for emitting different wavelengths (e.g. red, green, and blue wavelengths) can all be processed within the general sequence of operations of the embodiments.

In the following embodiments, the mass transfer of an array of pre-fabricated micro devices with an array of transfer heads is described. For example, the pre-fabricated micro devices may have a specific functionality such as, but not limited to, a LED for light-emission, silicon IC for logic and memory, and gallium arsenide (GaAs) circuits for radio frequency (RF) communications. In some embodiments, arrays of micro devices which are poised for pick up are described as having a 20 μm by 20 μm pitch, or 5 μm by 5 μm pitch. At these densities a 6 inch substrate, for example, can accommodate approximately 165 million micro devices with a 10 μm by 10 μm pitch, or approximately 660 million micro devices with a 5 μm by 5 μm pitch. A transfer tool including an array of transfer heads matching an integer multiple of the pitch of the corresponding array of micro devices can be used to pick up and transfer the array of micro devices to a receiving substrate. In this manner, it is possible to integrate and assemble micro devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

In the following description exemplary processing sequences are described for forming an array of micro devices within an array of staging cavities. Specifically, exemplary processing sequences are described for forming an array of micro LED devices and an array of micro chips. While the various sequences are illustrated and described separately, it is to be understood that the exemplary processing sequences share similar features and methods. Where possible, similar features are illustrated with similar annotations in the figures and following description.

FIG. 1A is a cross sectional side view illustration of a patterned conductive layer on a handle substrate in accordance with embodiments of the invention. Handle substrate 102 may be a variety of substrates, depending upon the particular micro device being formed. In an embodiment, where the micro devices being formed are micro LED devices, the handle substrate 102 may be a growth substrate suitable for the growth of an active device layer. In an embodiment, the handle substrate 102 is a sapphire substrate, silicon substrate, or SiC substrate for the growth of blue emitting or green emitting LED device. In an embodiment, the handle substrate 102 is a gallium arsenide (GaAs) substrate for the growth of red emitting LED devices. Cap layer 104 may optionally be formed between the device layer 106 and handle substrate 102. For example, the cap layer 104 may function as an etch stop layer to aid in subsequent removal of the handle substrate 102. Cap layer 104 may also be a bulk semiconductor layer used in the formation of the active device layer 106. Where the micro devices being formed are micro LED devices the active device layer 106 may include an n-doped layer, one or more quantum well layers, and a p-doped layer. Where the micro LED devices are designed to emit a red light (e.g. 620-750 nm wavelength) the device layer may include a material such as aluminum gallium arsenide (AlGaAs), gallium arsenide phosphide (GaAsP), aluminum gallium indium phosphide (AlGaInP), and gallium phosphide (GaP). Where the micro LED devices are designed to emit a green light (e.g. 495-570 nm wavelength) the device layer may include a material such as indium gallium nitride (InGaN), gallium nitride (GaN), gallium phosphide (GaP), aluminum gallium indium phosphide (AlGaInP), and aluminum gallium phosphide (AlGaP). Where the micro LED devices are designed to emit a blue light (e.g. 450-495 nm wavelength) the device layer may include a material such as gallium nitride (GaN), indium gallium nitride (InGaN), and zinc selenide (ZnSe).

In an embodiment, where the micro devices being formed are micro chips, the handle substrate 102 may be a semiconductor substrate such as a bulk silicon substrate. For example, the device layer 106, cap layer 104, and handle substrate 102 may be a silicon-on-insulator (SOI) substrate with the device layer 106 including device quality silicon, the cap layer 104 is a buried oxide layer, and the handle substrate 102 is a bulk silicon substrate.

In an embodiment, the cap layer 104 is 0.1-5 µm thick, and the device layer is 1-20 µm thick. A conductive contact layer may be formed over the device layer 106 using a suitable technique such as sputtering or electron beam deposition followed by etching or liftoff to form the array of conductive contacts 120. In an embodiment, the array of conductive contacts have a thickness of approximately 0.1-2 µm, and may include a plurality of different layers. A bonding layer may form the outermost surface of a conductive contact 120, and may be formed from a variety of materials for bonding to a receiving substrate, in an embodiment.

Referring now to FIG. 1B, the device layer 106 is patterned to form an array of laterally separate micro devices 175. A sacrificial release layer 140 is then deposited over the array of micro 175 devices and laterally between the micro devices, as illustrated in FIG. 1C. The thickness of the sacrificial release layer 140 may determine the amount that each micro device drops into a staging cavity when removed. In an embodiment, the sacrificial release layer 140 is 0.5-2 µm thick. The thickness of the sacrificial layer 142 may also at least partially determine the height of the openings 142, which will become the stabilization structure sidewalls 152. The thickness of the array of conductive contacts 120 and device layer 106 can also contribute to the height of the openings 142, which will become the stabilization structure sidewalls 152. In an embodiment, the sacrificial release layer 140 is not used to make electrical contact with the array of micro devices 175 and is formed of an electrically insulating material. In an embodiment, the sacrificial release layer 140 is formed of a material which can be readily and selectively removed with vapor (e.g. vapor HF) or plasma etching. For example, the sacrificial release layer 140 may be an oxide (e.g. $SiO_2$) or nitride (e.g. $SiN_x$), though other materials can be used. In an embodiment, the sacrificial release layer is deposited by sputtering, low temperature plasma enhanced chemical vapor deposition (PECVD), or electron beam evaporation to create a low quality layer which may be more easily removed than a higher quality layer. The sacrificial release layer 140 may also be deposited to be porous so that it may be more quickly etched.

Following the formation of the sacrificial release layer 140, a stabilization layer may be formed. Referring now to FIG. 1D, a stabilization layer 150 is formed over the sacrificial release layer 140 that is over the array of micro devices and laterally between the micro devices. In accordance with embodiments of the invention, a stabilization layer 150 formed of an adhesive bonding material. In accordance with some embodiments, the adhesive bonding material is a thermosetting material such as benzocyclobutene (BCB) or epoxy. In an embodiment, the thermosetting material may be associated with 10% or less volume shrinkage during curing, or more particularly about 6% or less volume shrinkage during curing so as to not delaminate from the sacrificial release layer 140. In order to increase adhesion to the underlying structure the underlying structure can be treated with an adhesion promoter such as AP3000, available from The Dow Chemical Company, in the case of a BCB stabilization layer in order to condition the underlying structure. AP3000, for example, can be spin coated onto the underlying structure, and soft-baked (e.g. 100° C.) or spun dry to remove the solvents prior to applying the stabilization layer 150 over the sacrificial release layer 140.

In an embodiment, stabilization layer 150 is spin coated or spray coated over the sacrificial release layer 140, though other application techniques may be used. Following application of the stabilization layer 150, the stabilization layer may be pre-baked to remove the solvents. In an embodiment, the stabilization layer 150 is thicker than the height of openings between the array of micro devices 175. In this manner, the thickness of the stabilization layer filling the openings will become the stabilization structure sidewalls 152, and the remainder of the thickness of the stabilization layer 150 over the filled openings 142 can function to adhesively bond the handle substrate 102 a carrier substrate.

Referring now to FIGS. 2A-2B, a carrier substrate 160 such as silicon is bonded with the handle substrate 102 using the stabilization layer 150. In an embodiment, carrier substrate 160 is treated with an adhesion promoter layer 162 such as AP3000 described above. The bonded structure is illustrated in FIG. 3A in accordance with an embodiment of the invention. In such an embodiment, stabilization layer 150 is cured at a temperature or temperature profile ranging between 150° C. and 300° C. Where stabilization layer 150 is formed of BCB, curing temperatures should not exceed approximately 350° C., which represents the temperature at which BCB begins to degrade. Depending upon the particular material selected, stabilization layer may be thermally cured, or cured with application of UV energy. Achieving a 100% full cure of the stabilization layer is not required in accordance with embodiments of the invention. More specifically, the stabilization layer 150 may be cured to a sufficient curing percentage (e.g. 70% or greater for BCB) at which point the stabilization layer 150 will no longer reflow. Partially cured (e.g.

70% or greater) BCB stabilization layer may possess sufficient adhesion strengths with the carrier substrate 160 and sacrificial release layer 140.

As described above, in an embodiment the stabilization layer 150 may be formed from a spin-on electrical insulator material. In such an embodiment, planarization and bonding can be accomplished in the same operation without requiring additional processing such as grinding or polishing. In accordance with another embodiment, the stabilization layer 150 can be formed over the sacrificial layer 140 and within openings 142 using a molding technique such as injection molding. In such an embodiment, the stabilization layer 150 may be fully cured during injection molding. The stabilization layer 150 may also be substantially thick so as to function as a carrier substrate and bonding to a carrier substrate is not required.

Figure 3B:
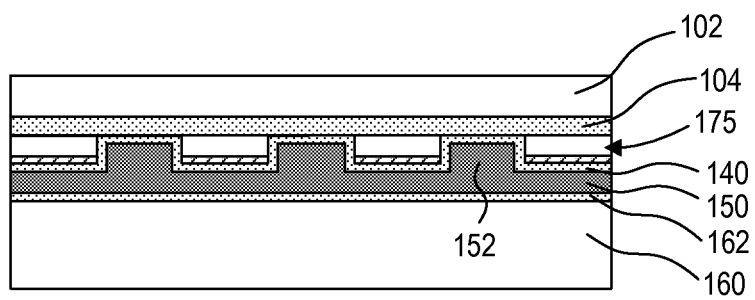
FIG. 3B is a cross-sectional side view illustration of a thinned handle substrate in accordance with an embodiment of the invention.
Figure 3C:
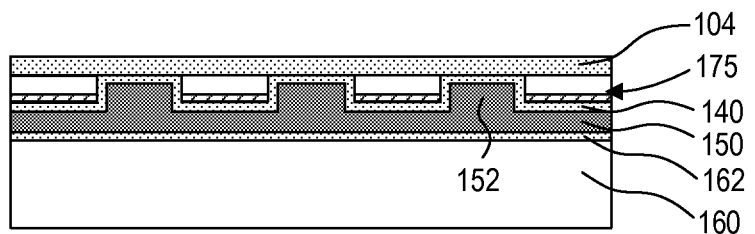
FIG. 3C is a cross-sectional side view illustration of a handle substrate removed from a carrier substrate in accordance with an embodiment of the invention.
Figure 3D:
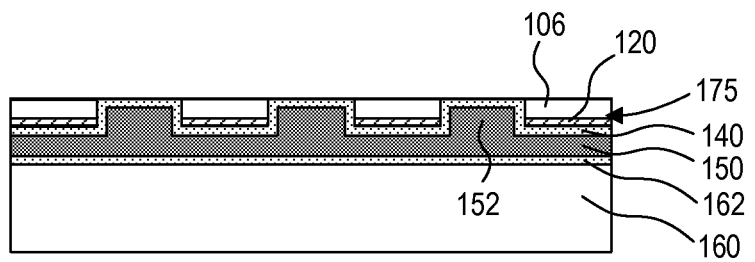
FIG. 3D is a cross-sectional side view illustration of a sacrificial cap layer removed from a stabilization structure in accordance with an embodiment of the invention.

Referring now to FIGS. 3B-3D, the handle wafer 102 is removed. This may be accomplished using a variety of techniques depending upon the materials selection, including laser lift off (LLO), grinding, and etching. For example, as illustrated in FIG. 3B, the handle wafer 102 is thinned down by grinding, followed by etching resulting in the structure illustrate in FIG. 3C. Where cap layer 104 is an etch stop layer, etching may stop on the etch stop layer. In an embodiment where the array of micro LED devices 175 are red-emitting LED devices, cap layer may be an etch stop layer, such as InGaP. In an embodiment where the array of micro LED devices are micro chips, cap layer may be a buried oxide layer. In an embodiment, where the array of micro LED devices 175 are blue-emitting or green-emitting LED devices, cap layer may be a GaN buffer layer. In an embodiment where cap layer 104 is a buffer layer, etching may be stopped using a timed etch. The cap layer 104, if present, is then removed as shown in FIG. 3D exposing the sacrificial release layer 140 and array of micro devices 175.

Figure 3E:
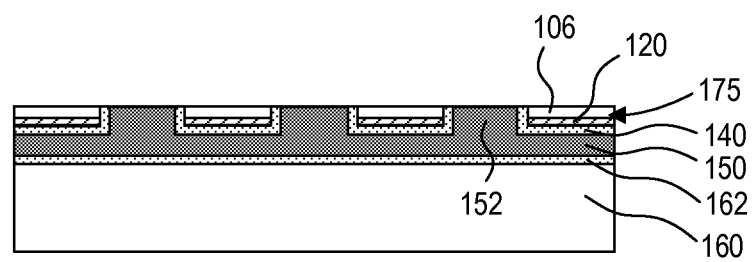
FIG. 3E is a cross-sectional side view illustration of an array of thinned down micro devices in accordance with an embodiment of the invention.

In an embodiment illustrated in FIG. 3E, the array of micro devices may be further thinned down. For example, where the original device layer 106 is too thick, or includes a buffer layer, additional thinning may be performed, for example, by chemical mechanical polishing (CMP) or etching.

In the embodiments illustrated in FIGS. 3D-3E, each micro device 175 is embedded in the sacrificial release layer 140 within a staging cavity. In such embodiments, the structure may be durable for handling and cleaning operations to prepare the structure for subsequent sacrificial release layer removal and electrostatic pick up. In an embodiment, the expose surfaces of the sacrificial release layer 140 and micro devices 175 are coplanar. For example, the exposed surfaces may be coplanar when cap layer 104 and sacrificial release layer 140 are formed of different materials. In an embodiment, the exposed surfaces of the micro devices 175 and stabilization structure sidewalls 152, and optionally sacrificial layer 140, are coplanar. For example, the exposed surfaces may be coplanar after thinning.

In an embodiment, the conductive contact 120 and device layer 106 for each micro device 175 are laterally surrounded by the stabilization structure sidewalls 152. For example, as illustrated in FIG. 3D, the bottom surface of the device layer 106 is below the top surface of the adjacent sidewalls 152 and the top surface of the conductive contact 120 is below the top surface of the adjacent sidewalls 152. In accordance with embodiments of the invention, the thickness of the device layer 106 may be partially or completely laterally surrounded by the adjacent sidewalls. For example, in the embodiment illustrated in FIG. 3D the thickness of the device layer 106 is partially laterally surrounded by sidewalls 152, with a bottom portion of the thickness of the device layer 106 being laterally surrounded by sidewalls 152 and a top portion of the thickness of the device layer 106 being above the sidewalls 152. In the embodiment illustrated in FIG. 3E, the thickness of the device layer 106 is completely laterally surrounded by sidewalls 152.

Figure 3F:
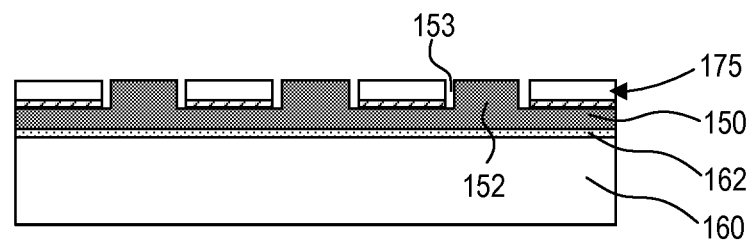
FIG. 3F is a cross-sectional side view illustration of a sacrificial release layer removed from a stabilization structure in accordance with an embodiment of the invention.
Figure 4:
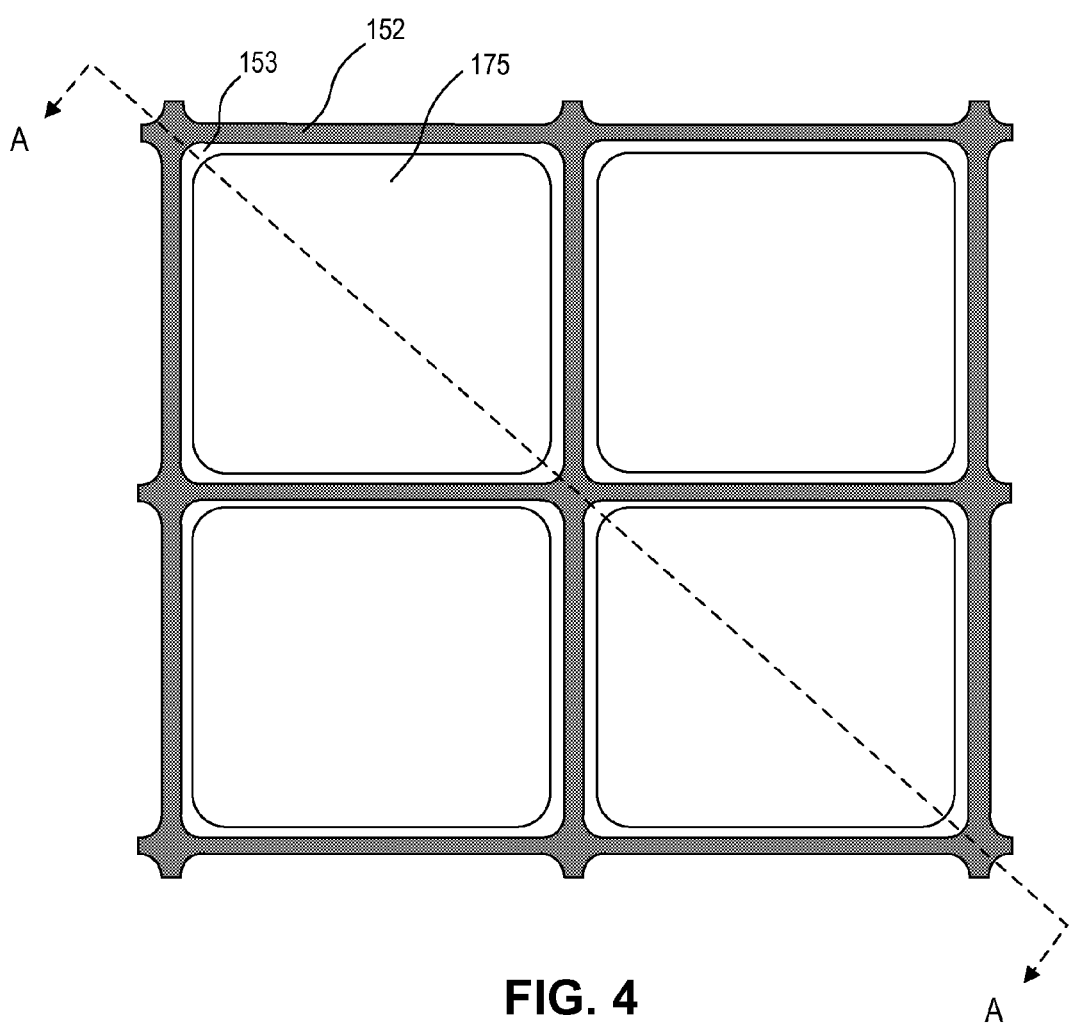
FIG. 4 is a top view illustration of an array of micro devices retained within an array of staging cavities after removal of a sacrificial release layer in accordance with an embodiment of the invention.

Referring now to FIG. 3F the sacrificial release layer 140 is removed. In the embodiment illustrated, removal of the sacrificial release layer results in the array of micro devices 175 dropping into the array of staging cavities 153, where each micro device is laterally surrounded by sidewalls of a corresponding staging cavity. A top view illustration of an array of micro devices retained within an array of staging cavities is provided in FIG. 4. As illustrated the side view illustrations of FIG. 3F is taken along line A-A in FIG. 4. A suitable etching chemistry such as an HF vapor, or $CF_4$ or $SF_6$ plasma can be used to remove the sacrificial release layer 140.

In accordance with embodiments of the invention, the array of micro devices 175 are held within the corresponding array of staging cavities 153 in which each micro device is laterally surrounded by sidewalls 152 of a corresponding staging cavity. Each sidewall 152 may be shared by an adjoining staging cavity 153. In an embodiment, each micro device has a maximum width of 1-100 µm. In an embodiment, each staging cavity has a maximum width of 1-100 µm. The staging cavities should be slightly larger than each micro device, the difference being determined by twice a thickness of the sacrificial release layer 140. Where the sacrificial release layer is 0.5-2 µm thick, this may correspond to a difference in maximum widths of 1-4 µm. Though wider ranges are possible in accordance with embodiments of the invention, such as 0.5-20 µm. In an embodiment, the sidewalls 152 are between 0.5-20 µm wide.

Figure 5A:
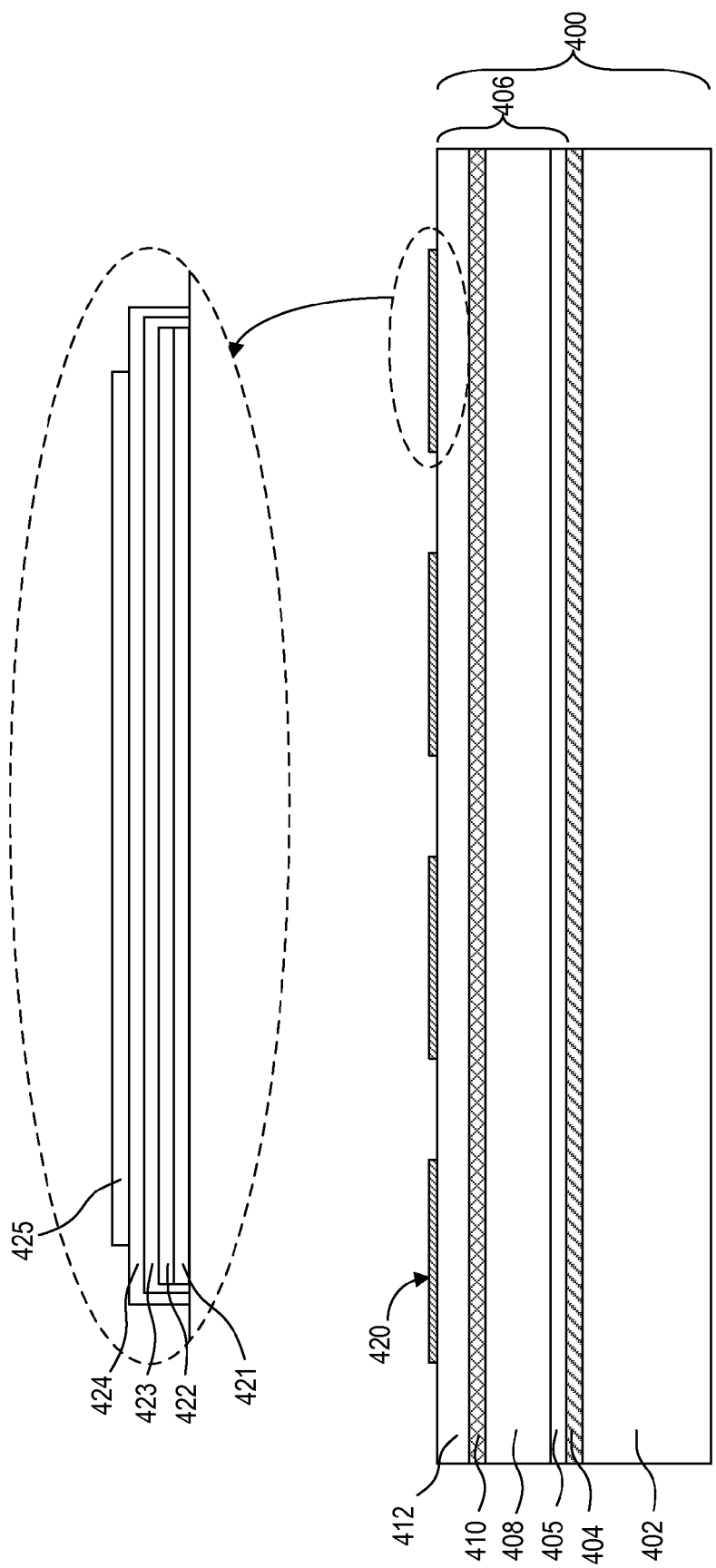
FIG. 5A is a cross-sectional side view illustration of a p-n diode layer formed over a handle substrate in accordance with an embodiment of the invention.
Figure 5B:
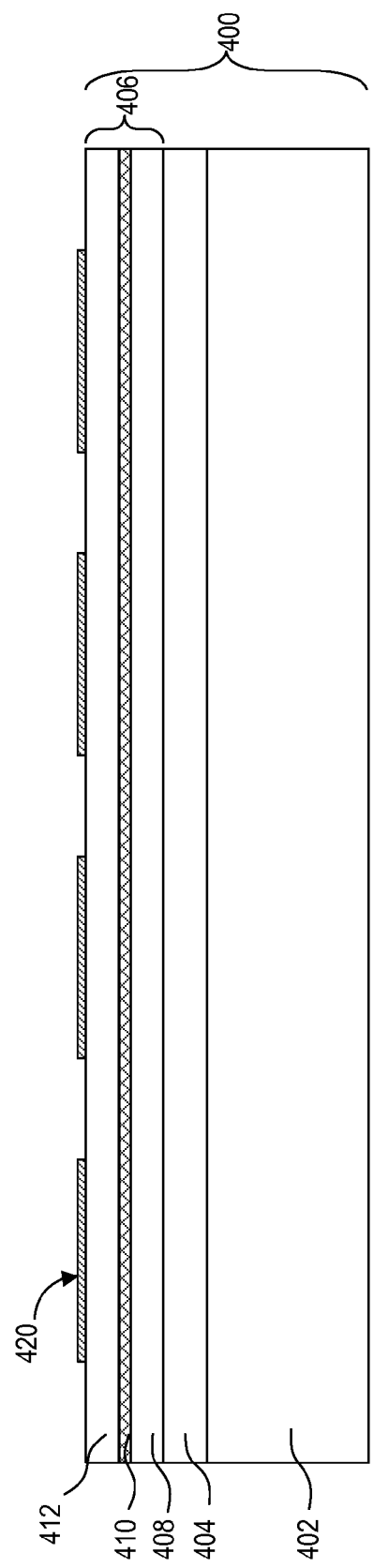
FIG. 5B is a cross-sectional side view illustration of a p-n diode layer formed over a handle substrate in accordance with an embodiment of the invention.

Referring now to FIGS. 5A-5B cross-sectional side view illustrations of different p-n diode layer configurations formed over a handle substrate are provided in accordance with an embodiment of the invention. In an embodiment, the structure illustrated in FIG. 5A is a red-emitting p-n diode structure 400. In an embodiment, substrate 402 is formed of GaAs, and is approximately 500 µm thick. The etch stop layer 404 may be formed of InGaP and approximately 2,000 angstroms thick. The ohmic layer 405 may be formed of GaAs and approximately 500 angstroms thick. In an embodiment, n-doped layer 408 is formed of AlGaInP, and is approximately 1 µm to 3 µm thick. The one or more quantum well layers 410 may have a thickness of approximately 0.5 µm. In an embodiment, p-doped layer 412 is formed of GaP, and is approximately 1 µm to 2 µm thick.

In an embodiment, the array of conductive contacts 420 have a thickness of approximately 0.1 µm-2 µm, and may include a plurality of different layers. For example, a conductive contact 420 may include an electrode layer 421 for ohmic contact, a minor layer 422, an adhesion/barrier layer 423, a diffusion barrier layer 425, and a bonding layer 425. In an embodiment, electrode layer 421 may make ohmic contact to the p-doped GaP layer 412, and may be formed of a high work-function metal such as nickel. In an embodiment, a minor layer 422 such as silver is formed over the electrode layer 421 to reflect the transmission of the visible wavelength. In an embodiment, titanium is used as an adhesion/barrier layer 423, and platinum is used as a diffusion barrier 424 to bonding layer 425. Bonding layer 425 may be formed of a variety of materials which can be chosen for bonding to the receiving substrate. Following the formation of layers 421-425, the substrate stack can be annealed to form an ohmic contact. For example, a p-side ohmic contact may be formed by annealing the substrate stack at 510° C. for 10 minutes.

In an embodiment, bonding layer 425 is formed of a conductive material (both pure metals and alloys) which can diffuse with a metal forming a contact pad on a receiving substrate (e.g. silver, gold, indium, bismuth, tin contact pad). Where bonding layer 425 has a liquidus temperature below the annealing temperature for forming the p-side ohmic contact, the bonding layer may be formed after annealing.

In an embodiment, the structure illustrated in FIG. 5B is a blue-emitting p-n diode structure 400. In such an embodiment, handle wafer 402 may be sapphire, silicon, or SiC, and device layer 406 is formed of GaN. In an embodiment, a buffer GaN layer 404 is grown over the handle wafer 402, and device layer 406 includes an n-doped GaN layer 408, one or more quantum wells 410, and a p-doped GaN layer 412. In an embodiment, the handle wafer 402 is approximately 200 μm thick, the buffer GaN layer 404 is 5 μm thick, n-doped layer 408 is 0.1-3 μm thick, quantum well layer 410 is less than 0.3 μm thick, and the p-doped layer 412 is approximately 0.1-6 μm thick. The array of conductive contacts 420 may be formed similarly as described with regard to FIG. 5A. In an embodiment, a different arrangement of materials can be used for the electrode layer 422 or minor layer 421.

Figure 5C:
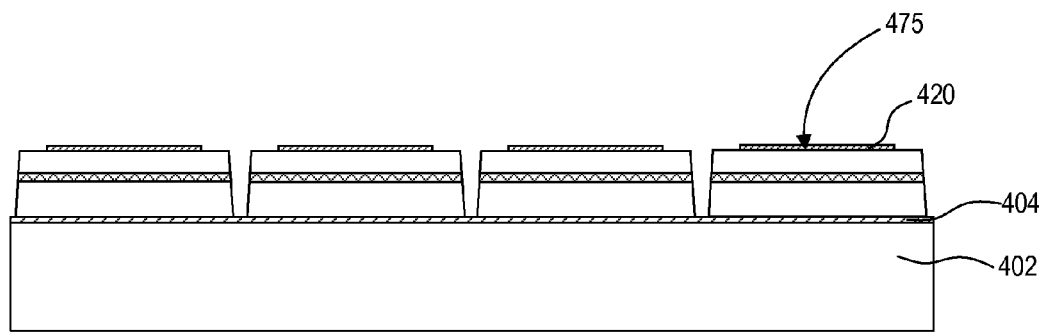
FIGS. 5C-5H are cross-sectional side view illustrations for a method of fabricating an array of micro LED devices within an array of staging cavities in accordance with embodiments of the invention.
Figure 5D:
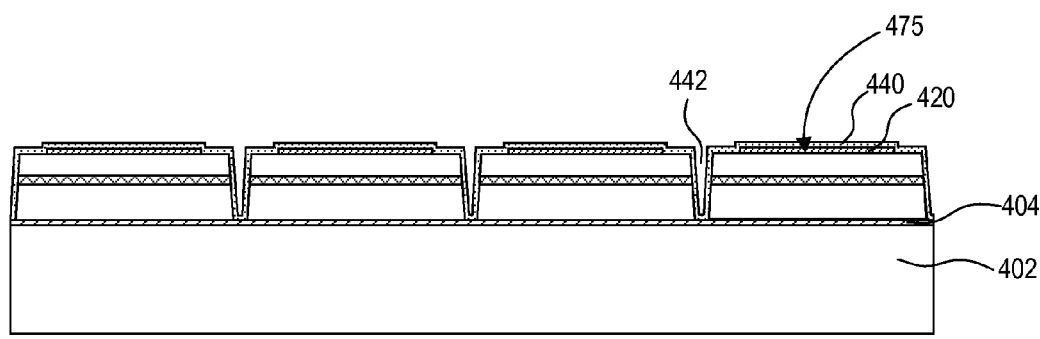

FIGS. 5C-5H are cross-sectional side view illustrations for a method of fabricating an array of micro LED devices within an array of staging cavities in accordance with embodiments of the invention. Referring to FIG. 5C, the device layer 406 is patterned to form an array of laterally separate micro LED devices 475. In the embodiment illustrated, etching stops on the cap layer 404, which may be an etch stop layer or buffer layer as described above. The particular etching technique and chemistry may be selected for the particular materials. For example, dry etching techniques such as reactive ion etching (RIE), electro-cyclotron resonance (ECR), inductively coupled plasma reactive ion etching ICP-RIE, and chemically assisted ion-beam etching (CAIBE) may be used. The etching chemistries may be halogen based, containing species such as $Cl_2$, $BCl_3$, or $SiCl_4$.

Following etching to form an array of laterally separate micro LED devices 475, a sacrificial release layer 440 is deposited over the array of micro LED devices 475 and laterally between the micro LED devices. In accordance with embodiments of the invention, the remaining openings 442 between the micro LED devices 475 will correspond to the size of the sidewalls 452 of the staging cavities. The thickness of the array of conductive contacts 420 and device layer 406 can also contribute to the height of the openings 442, which will become the stabilization structure sidewalls 452 following the formation of stabilization layer 450. In an embodiment, the sacrificial release layer 440 is not used to make electrical contact with the array of micro LED devices 475 and is formed of an electrically insulating material. In an embodiment, the sacrificial release layer 440 is formed of a material which can be readily and selectively removed with vapor (e.g. vapor HF) or plasma etching. As described above, the in an embodiment, the sacrificial release layer 440 is formed of an oxide or nitride, with a thickness of 0.5-2 μm.

Figure 5E:
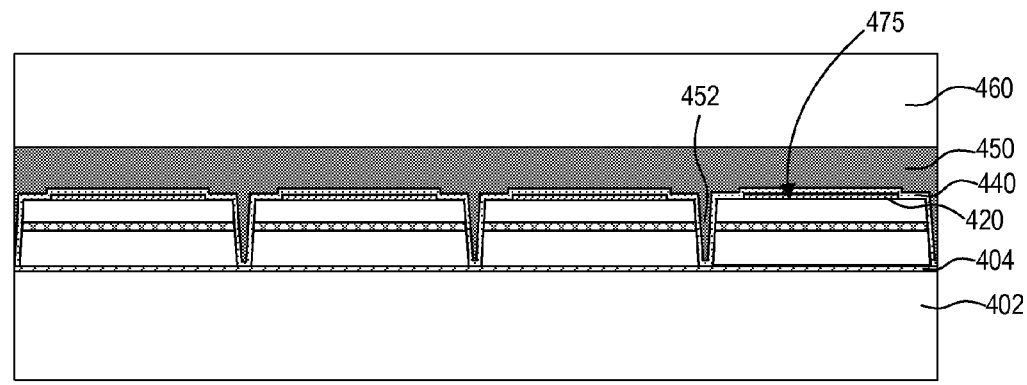

Referring to FIG. 5E, in an embodiment the stabilization layer 450 is formed over the sacrificial release layer 440 that is over the array of micro LED devices and laterally between the array of micro LED devices, and the portion of the stabilization layer 450 within the openings 442 becomes the stabilization structure sidewalls 452. In an embodiment, the stabilization layer 450 is formed of a thermoset material such as BCB. Bonding of the carrier substrate 460 to the handle substrate 402 may include curing of the thermoset material. As described above, in an embodiment the stabilization layer 450 may be formed from a spin-on electrical insulator material. In such an embodiment, planarization and bonding can be accomplished in the same operation without requiring additional processing such as grinding or polishing. In accordance with another embodiment, the stabilization layer 450 can be formed over the sacrificial layer 440 using a molding technique such as injection molding. In such an embodiment, the stabilization layer 450 may be fully cured during injection molding. The stabilization layer 450 may also be substantially thick so as to function as a carrier substrate and bonding to a carrier substrate is not required.

Figure 5F:
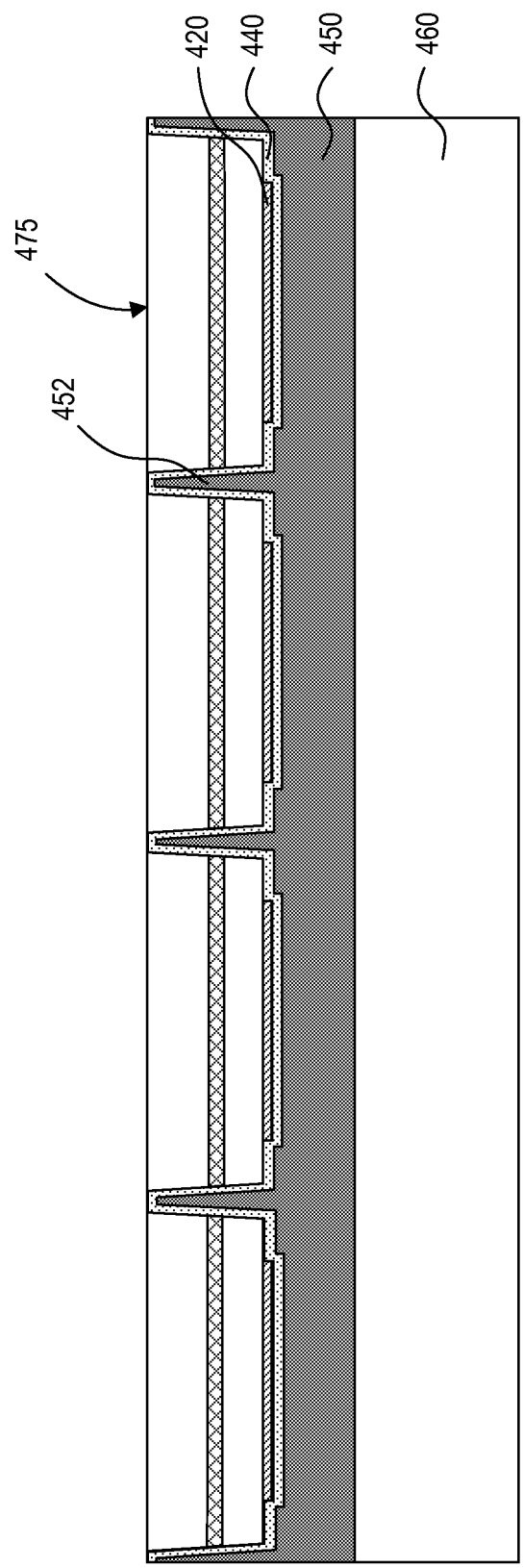

Referring now to FIG. 5F, the handle substrate 402 and cap layer 404 are removed. In one embodiment, the handle substrate 402 may be removed using a LLO method. In other embodiments, the handle substrate may be removed using grinding, etching, or a combination of grinding and etching. Similarly cap layer 404 may be removed by etching after removing the handle substrate. Where cap layer 404 is an etch stop layer, the cap layer 404 may be formed from a different material than the underlying structures. For example, an InGaP etch stop layer 104 may be removed by an $HCl+H_3PO_4$ wet etching solution. Where cap layer 404 is a buffer layer, the cap layer 404 may be removed using the same etching chemistry used to pattern the device layer 106. In an embodiment, the array of micro LED devices 475 may be further thinned down as previously described above with regard to FIG. 3E. For example, CMP or the same etching chemistry used to pattern the device layer 106 may be used to thin down the array of micro LED devices 475. In an embodiment, the expose surfaces of the sacrificial release layer 440 and micro LED devices 475 are coplanar. For example, the exposed surfaces may be coplanar when cap layer 404 and sacrificial release layer 440 are formed of different materials. In an embodiment, the exposed surfaces of the micro LED devices 475 and stabilization structure sidewalls 452, and optionally sacrificial layer 440, are coplanar. For example, the exposed surfaces may be coplanar after thinning.

In an embodiment, the conductive contact 420 and device layer 406 for each micro LED device 475 are laterally surrounded by the stabilization structure sidewalls 452. For example, as illustrated in FIG. 5F, the bottom surface of the device layer 406 is below the top surface of the adjacent sidewalls 452 and the top surface of the conductive contact 420 is below the top surface of the adjacent sidewalls 452. In accordance with embodiments of the invention, the thickness of the device layer 406 may be partially or completely laterally surrounded by the adjacent sidewalls. For example, in the embodiment illustrated in FIG. 5F the thickness of the device layer 406 is partially laterally surrounded by sidewalls 452, with a bottom portion of the thickness of the device layer 406 being laterally surrounded by sidewalls 452 and a top portion of the thickness of the device layer 406 being above the sidewalls 452. For example, the top portion of the thickness of the device layer 406 may extend above the sidewalls 452 by the thickness of the sacrificial release layer 440 formed at the bottom of openings 442 illustrated in FIG. 5D. In another embodiment, the thickness of the device layer 406 may be completely laterally surrounded by sidewalls 452.

Figure 5G:
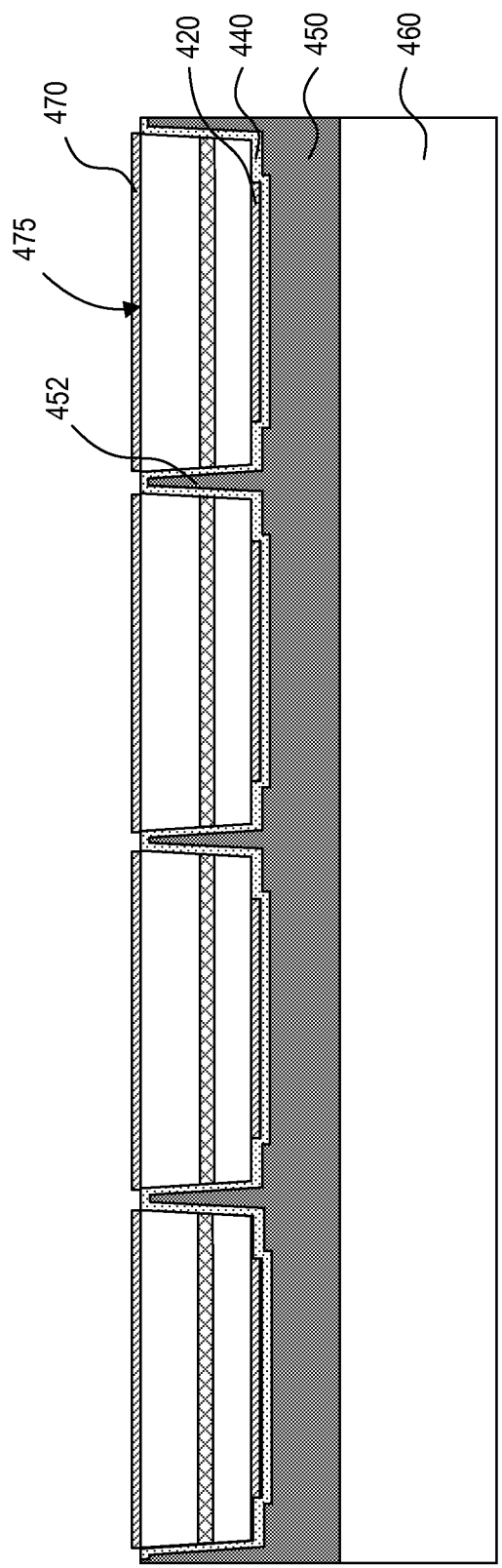

Referring now to FIG. 5G, an array of top conductive contacts 470 may optionally be formed over the array of micro LED devices 475. Conductive contacts may be formed using a suitable technique such as electron beam physical deposition. In an embodiment, conductive contacts 470 include a BeAu metal alloy, or a metal stack of Au/GeAuNi/Au layers. Conductive contacts 470 may also be a conductive oxide such as indium-tin-oxide (ITO), or a combination of one or more metal layers and a conductive oxide. In an embodiment, the conductive contacts 470 are annealed to generate an ohmic contact with the array of micro LED devices 475. Where the stabilization layer 450 is formed of BCB, the annealing temperature may be below 350° C. In an embodiment, annealing is performed between 200° C. and 350° C., or more particularly at approximately 320° C. for approximately 10 minutes. In an embodiment, conductive contacts 470 have a thickness of 50 angstroms. Where conductive contacts are metal, the thickness may be thin for transparency reasons. In an embodiment where conductive contacts are formed of a transparent material such as ITO, the conductive contacts may be thicker, such as 1,000 to 2,000 angstroms.

Figure 5H:
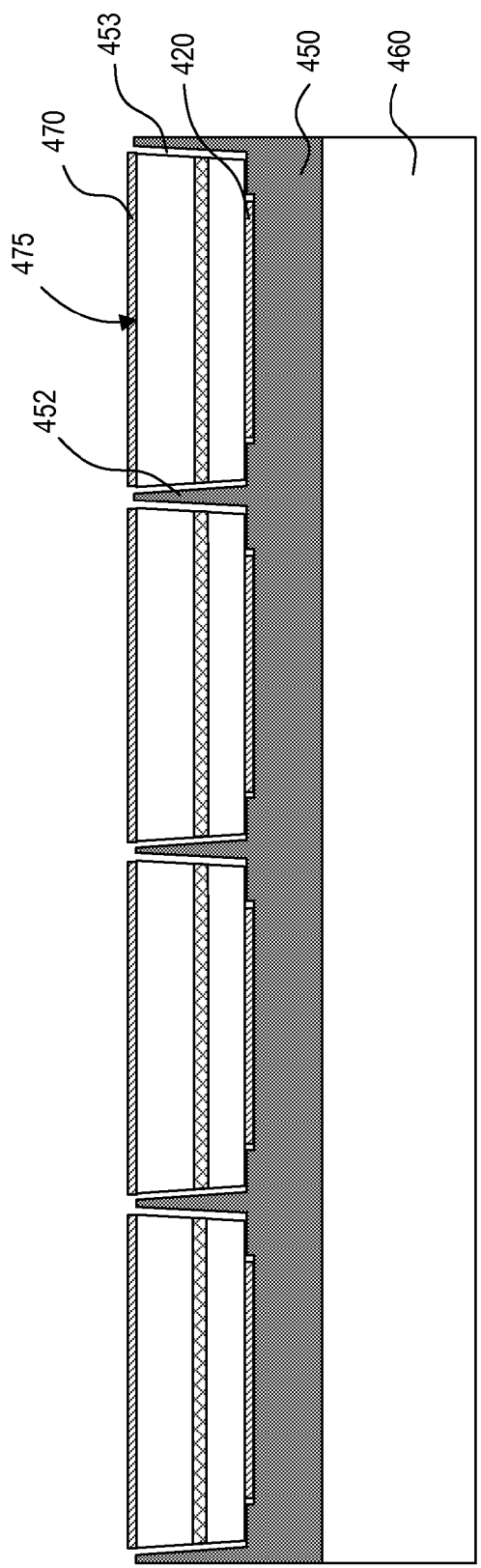

Referring now to FIG. 5H, the sacrificial release layer 440 may be removed, resulting in the array of micro LED devices 475 dropping into the array of staging cavities 453, where each micro LED device is laterally surrounded by sidewalls 452 of a corresponding staging cavity 453. In an embodiment, a suitable etching chemistry such as an HF vapor, or $CF_4$ or $SF_6$ plasma can be used to remove the sacrificial release layer 440.

Figure 6E:
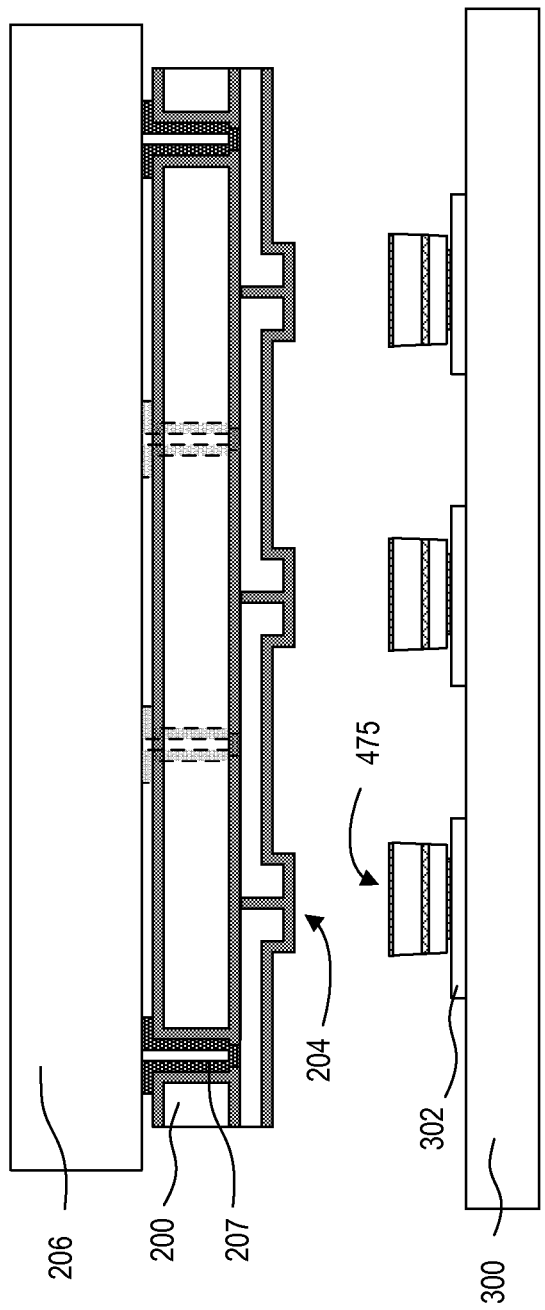

Following removal of the sacrificial release layer 440, the released array of micro devices is poised for pick up and transfer to a receiving substrate. FIGS. 6A-6E are cross-sectional side view illustrations for a method of transferring an array of micro LED devices from a carrier substrate to a receiving substrate in accordance with embodiments of the invention. FIG. 6A is a cross-sectional side view illustration of an array of micro device transfer heads 204 supported by substrate 200 and positioned over an array of micro LED devices 475 retained within a corresponding array of staging cavities 453 in accordance with an embodiment of the invention. The array of micro LED devices 475 are then contacted with the array of transfer heads 204 as illustrated in FIG. 6B. As illustrated, the pitch of the array of transfer heads 204 is an integer multiple of the pitch of the array of micro LED devices 475. A voltage is applied to the array of transfer heads 204. The voltage may be applied from the working circuitry within a transfer head assembly 206 in electrical connection with the array of transfer heads through vias 207. The array of micro LED devices 475 is then picked up with the array of transfer heads 204 as illustrated in FIG. 6C. The array of micro LED devices 475 is then brought into contact with contact pads 302 (e.g. gold, indium, or tin) on receiving substrate 300 as illustrated in FIG. 6D. For example, the receiving substrate may be, but is not limited to, a display substrate, a lighting substrate, a substrate with functional devices such as transistors or ICs, or a substrate with metal redistribution lines.

In one embodiment, an operation is performed to diffuse a bonding layer connecting the array of micro devices 475 with the contact pads 302 while contacting the array of micro devices with the contact pads 302. For example, a silver, gold, indium, or tin bonding layer may be diffused with a silver, gold, indium, or tin contact pad 302, though other materials may be used. In an embodiment, sufficient diffusion to adhere the array of micro LED devices 475 with the array of contact pads 302 can be achieved at temperatures of less than 200° C. For example, heat can be applied from a heat source located within the transfer head assembly 206 and/or receiving substrate 300.

The operation of applying the voltage to create a grip pressure on the array of micro devices can be performed in various orders. For example, the voltage can be applied prior to contacting the array of micro devices with the array of transfer heads, while contacting the micro devices with the array of transfer heads, or after contacting the micro devices with the array of transfer heads. The voltage may also be applied prior to, while, or after creating a phase change in the bonding layer.

Where the transfer heads 204 include bipolar electrodes, an alternating voltage may be applied across a the pair of electrodes in each transfer head 204 so that at a particular point in time when a negative voltage is applied to one electrode, a positive voltage is applied to the other electrode in the pair, and vice versa to create the pickup pressure. Releasing the array of micro devices from the transfer heads 204 may be further accomplished with a varied of methods including turning off the voltage sources, lower the voltage across the pair of silicon electrodes, changing a waveform of the AC voltage, and grounding the voltage sources.

Figure 7A:
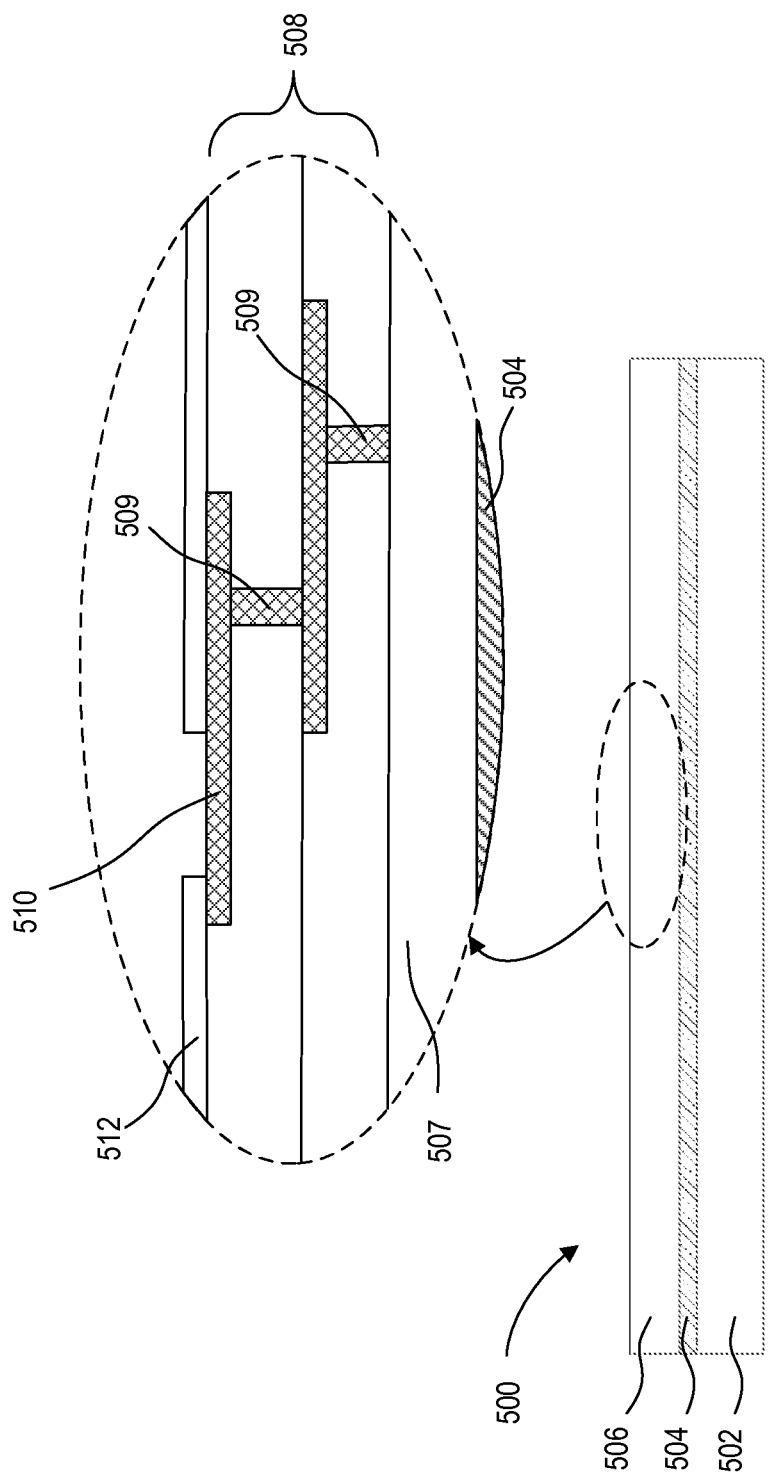
FIGS. 7A-7G are cross-sectional side view illustrations for a method of fabricating an array of micro chips within an array of staging cavities in accordance with embodiments of the invention.

FIGS. 7A-7G are cross-sectional side view illustrations for a method of fabricating an array of micro chips within an array of staging cavities in accordance with embodiments of the invention. FIG. 7A is a cross-sectional side view illustration of a device wafer including circuitry in accordance with embodiments of the invention. In accordance with embodiments of the invention, the device wafer 500 may be formed of a variety of materials depending upon the desired function. For example, in an embodiment, the device wafer 500 is a silicon wafer, or silicon-on-insulator (SOI) wafer for logic or memory. In an embodiment, the device wafer 500 is a gallium arsenide (GaAs) wafer for radio frequency (RF) communications. These are merely examples, and embodiments of the invention envision are not limited to silicon or GaAS wafers, nor are embodiments limited to logic, memory, or RF communications.

In an embodiment, the device wafer 500 includes an active device layer 506, optional buried oxide layer 504, and handle substrate 502. In interest of clarity, the following description is made with regard to an SOI device wafer 500, including an active device layer 506, buried oxide layer 504, and silicon handle substrate 502, though other types of devices wafers may be used, including bulk semiconductor wafers. In an embodiment, the active device layer 506 may include working circuitry to control one or more LED devices when placed display or lighting substrate. In some embodiments, back-end processing may be performed within the active device layer. Accordingly, in an embodiment, the active device layer 506 includes an active silicon layer 507 including a device such as a transistor, metal build-up layers 508 including interconnects 509, bonding pads 510, and passivation 512.

Figure 7B:
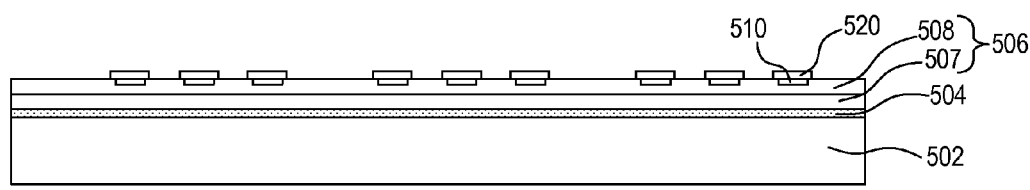

Referring now to FIG. 7B, an array of conductive contacts 520 may be formed over the active device layer 506. The array of conductive contacts 520 may make contact with contact pads 510 formed in the active device layer 506 during back-end processing. In an embodiment, the conductive contacts 520 include a seed layer such as a Ti/TiW/Ag or Ti/TiW/Cu stack, though other materials may be used. In an embodiment, the seed layer is less than 1 µm thick. A bonding layer may also be included over the seed layer in the conductive contacts 520. Bonding layer may be formed of a variety of materials which can be chosen for bonding to the receiving substrate. The array of conductive contacts 520 may be formed similarly as described above for conductive contacts 120, 420.

Figure 7C:
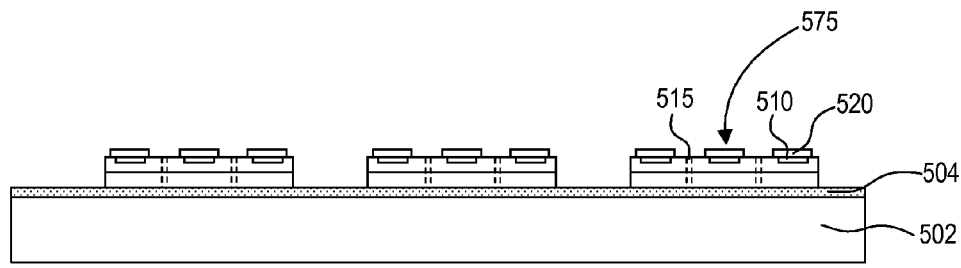
Figure 7D:
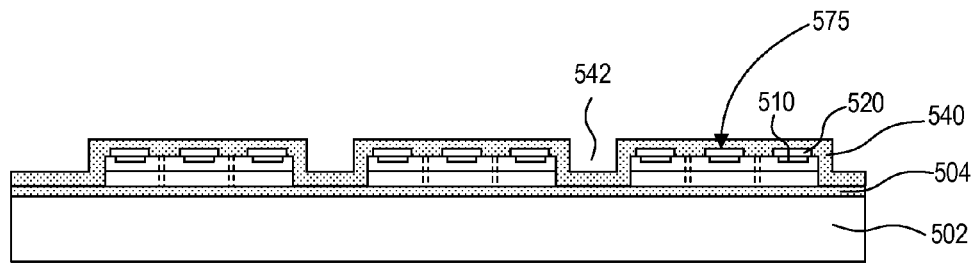

FIGS. 7C-7G are cross-sectional side view illustrations for a method of fabricating an array of micro chips within an array of staging cavities in accordance with embodiments of the invention. Referring to FIG. 7C, the device layer 506 is patterned to form an array of laterally separate micro chips 575. Patterning may be performed by a variety of etching methods, stopping on the cap layer 504. In an embodiment, etching is performed using positive photoresist lithography, and DRIE to form openings between the array of laterally separate micro chips 575. In an embodiment, one or more through holes 515 may also be formed through the micro chips 575.

Following etching to form an array of laterally separate micro chips 575, a sacrificial release layer 540 is deposited over the array of micro chips 575 and laterally between the micro chips 575. In accordance with embodiments of the invention, the remaining openings 542 between the micro chips 575 will correspond to the size of the sidewalls 552 of the staging cavities. The thickness of the array of conductive contacts 520 and device layer 506 can also contribute to the height of the openings 542, which will become the stabilization structure sidewalls 552 following the formation of stabilization layer 550. In an embodiment, the sacrificial release layer 540 is not used to make electrical contact with the array of micro chips 575 and is formed of an electrically insulating material. In an embodiment, the sacrificial release layer 540 is formed of a material which can be readily and selectively removed with vapor (e.g. vapor HF) or plasma etching. As described above, the in an embodiment, the sacrificial release layer 540 is formed of an oxide or nitride, with a thickness of 0.5-2 µm.

Figure 7E:
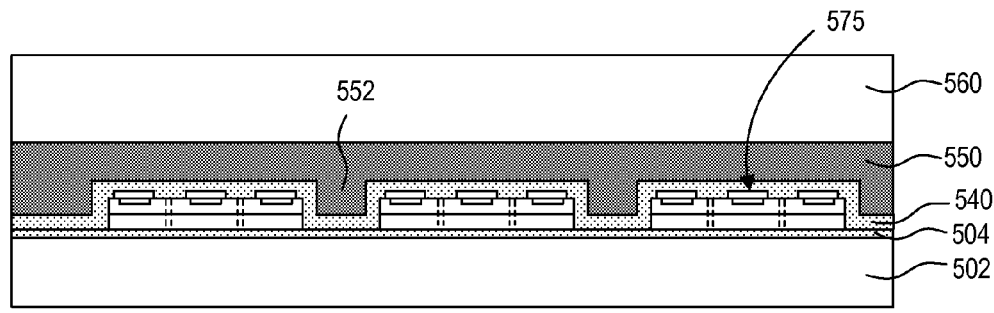

Referring to FIG. 7E, in an embodiment the stabilization layer 550 is formed over the sacrificial release layer 540 that is over the array of chips and laterally between the array of micro chips, and the portion of the stabilization layer 550 within the openings 542 becomes the stabilization structure sidewalls 552. In an embodiment, the stabilization layer 550 is formed of a thermoset material such as BCB. Bonding of the carrier substrate 560 to the handle substrate 502 may include curing of the thermoset material. As described above, in an embodiment the stabilization layer 550 may be formed from a spin-on electrical insulator material. In such an embodiment, planarization and bonding can be accomplished in the same operation without requiring additional processing such as grinding or polishing. In accordance with another embodiment, the stabilization layer 550 can be formed over the sacrificial layer 540 using a molding technique such as injection molding. In such an embodiment, the stabilization layer 550 may be fully cured during injection molding. The stabilization layer 550 may also be substantially thick so as to function as a carrier substrate and bonding to a carrier substrate is not required.

Figure 7F:
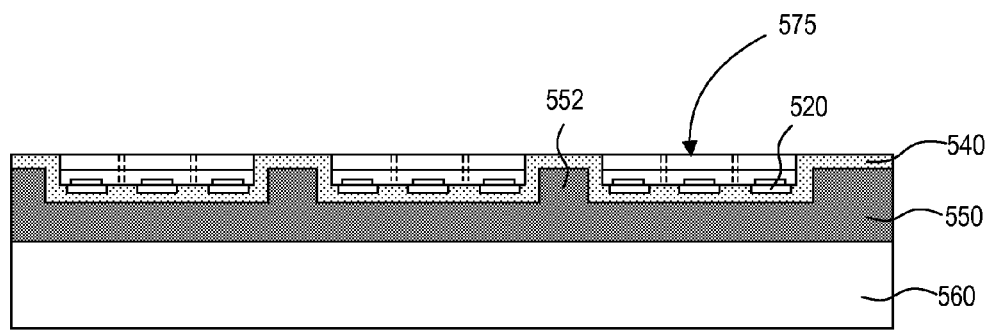

Referring now to FIG. 7F, the handle substrate 502 and cap layer 504 are removed. In one embodiment, the handle substrate 502 may be removed using grinding, etching, or a combination of grinding and etching. Similarly cap layer 504 may be removed by etching after removing the handle substrate. Where cap layer 504 is an etch stop layer, the cap layer 504 may be formed from a different or same material than the underlying structures. In an embodiment, the array of micro chips 575 may be further thinned down. For example, CMP or the same etching chemistry used to pattern the device layer 515 may be used to thin down the array of micro chips devices 575. In an embodiment, the expose surfaces of the sacrificial release layer 540 and micro chips 575 are coplanar. For example, the exposed surfaces may be coplanar when cap layer 504 and sacrificial release layer 540 are formed of different materials. In an embodiment, the exposed surfaces of the micro chips 575 and stabilization structure sidewalls 552, and optionally sacrificial layer 540, are coplanar. For example, the exposed surfaces may be coplanar after thinning.

In an embodiment, the conductive contacts 520 and device layer 506 for each micro chip 575 are laterally surrounded by the stabilization structure sidewalls 552. For example, as illustrated in FIG. 7F, the bottom surface of the device layer 506 is below the top surface of the adjacent sidewalls 552 and the top surface of the conductive contact 520 is below the top surface of the adjacent sidewalls 552. In accordance with embodiments of the invention, the thickness of the device layer 506 may be partially or completely laterally surrounded by the adjacent sidewalls. For example, in the embodiment illustrated in FIG. 7F the thickness of the device layer 506 is partially laterally surrounded by sidewalls 552, with a bottom portion of the thickness of the device layer 506 being laterally surrounded by sidewalls 552 and a top portion of the thickness of the device layer 506 being above the sidewalls 552. For example, the top portion of the thickness of the device layer 506 may extend above the sidewalls 552 by the thickness of the sacrificial release layer 540 formed at the bottom of openings 542 illustrated in FIG. 7D. In another embodiment, the thickness of the device layer 506 may be completely laterally surrounded by sidewalls 552.

Figure 7G:
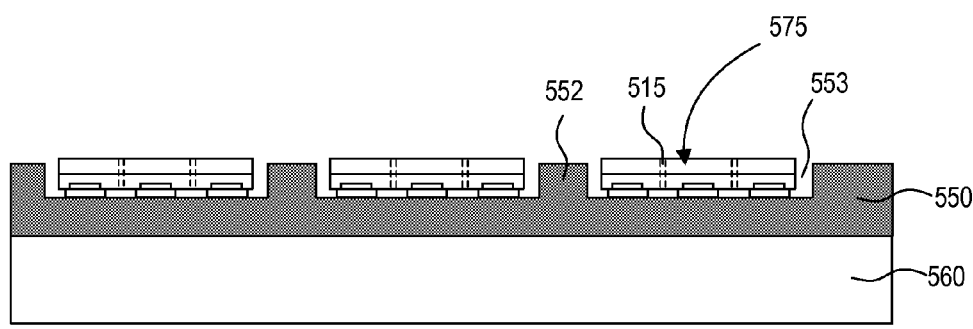

Referring now to FIG. 7G, the sacrificial release layer 540 may be removed, resulting in the array of micro chips 575 dropping into the array of staging cavities 553, where each micro chip is laterally surrounded by sidewalls 552 of a corresponding staging cavity 553. In an embodiment, a suitable etching chemistry such as an HF vapor, or $CF_4$ or $SF_6$ plasma can be used to remove the sacrificial release layer 540. In an embodiment where cap layer 504 and the sacrificial release layer 540 are formed of the same material (e.g. oxide), they may be removed with the same etching chemistry. Through holes 515 formed through the micro chips 575 may assist in achieving complete removal of the sacrificial release layer 540, and provide multiple paths for the etching chemistry to etch beneath the micro chips 575.

Figure 8E:
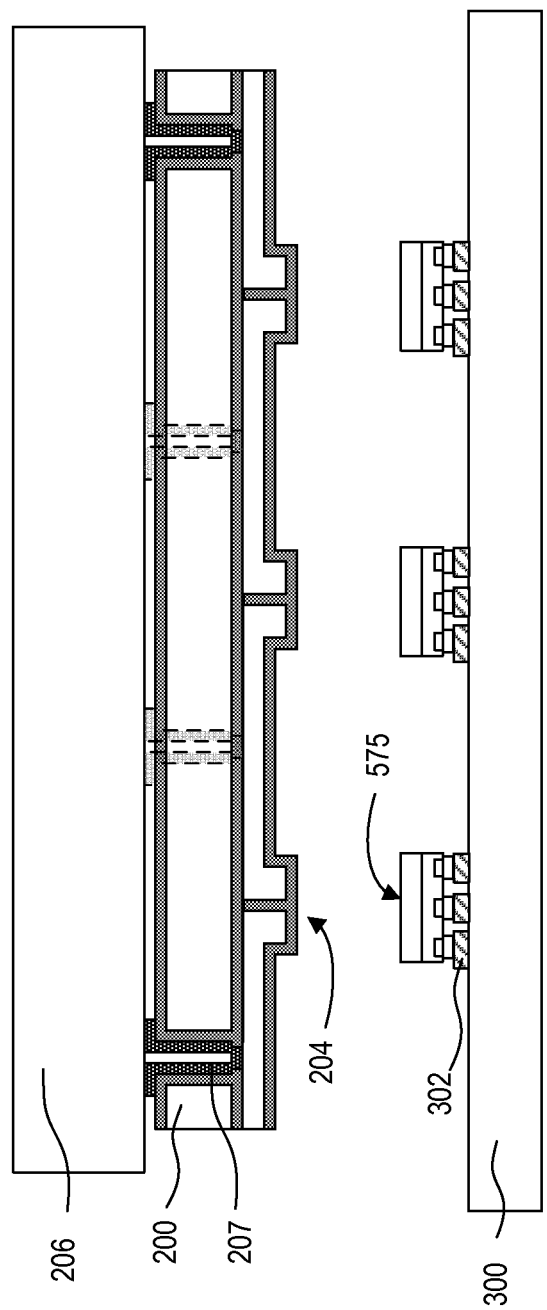

Following removal of the sacrificial release layer 540, the released array of micro chips is poised for pick up and transfer to a receiving substrate. FIGS. 8A-8E are cross-sectional side view illustrations for a method of transferring an array of micro chips from a carrier substrate to a receiving substrate in accordance with embodiments of the invention. FIG. 8A is a cross-sectional side view illustration of an array of micro device transfer heads 204 supported by substrate 200 and positioned over an array of micro chips 575 retained within a corresponding array of staging cavities 553 in accordance with an embodiment of the invention. The array of micro chips 575 are then contacted with the array of transfer heads 204 as illustrated in FIG. 8B. As illustrated, the pitch of the array of transfer heads 204 is an integer multiple of the pitch of the array of micro chips 575. A voltage is applied to the array of transfer heads 204. The voltage may be applied from the working circuitry within a transfer head assembly 206 in electrical connection with the array of transfer heads through vias 207. The array of micro chips 575 is then picked up with the array of transfer heads 204 as illustrated in FIG. 8C. The array of micro chips 575 is then brought into contact with contact pads 302 (e.g. gold, indium, or tin) on receiving substrate 300 as illustrated in FIG. 8D. For example, the receiving substrate may be, but is not limited to, a display substrate, a lighting substrate, a substrate with functional devices such as transistors or ICs, or a substrate with metal redistribution lines.

In one embodiment, an operation is performed to diffuse a bonding layer connecting the array of micro chips 575 with the contact pads 302 while contacting the array of micro chips with the contact pads 302. For example, a silver, gold, indium, or tin bonding layer may be diffused with a silver, gold, indium, or tin contact pad 302, though other materials may be used. In an embodiment, sufficient diffusion to adhere the array of micro chips 575 with the array of contact pads 302 can be achieved at temperatures of less than 200° C. For example, heat can be applied from a heat source located within the transfer head assembly 206 and/or receiving substrate 300.

The operation of applying the voltage to create a grip pressure on the array of micro devices can be performed in various orders. For example, the voltage can be applied prior to contacting the array of micro devices with the array of transfer heads, while contacting the micro devices with the array of transfer heads, or after contacting the micro devices with the array of transfer heads. The voltage may also be applied prior to, while, or after creating a phase change in the bonding layer.

Where the transfer heads 204 include bipolar electrodes, an alternating voltage may be applied across a the pair of electrodes in each transfer head 204 so that at a particular point in time when a negative voltage is applied to one electrode, a positive voltage is applied to the other electrode in the pair, and vice versa to create the pickup pressure. Releasing the array of micro chips from the transfer heads 204 may be further accomplished with a varied of methods including turning off the voltage sources, lower the voltage across the pair of silicon electrodes, changing a waveform of the AC voltage, and grounding the voltage sources.

In utilizing the various aspects of this invention, it would become apparent to one skilled in the art that combinations or variations of the above embodiments are possible for stabilizing an array of micro devices on a carrier substrate, and for transferring the array of micro devices. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A stabilization structure comprising:
   a carrier substrate;
   an array of micro devices on the carrier substrate, wherein each micro device includes a device layer with a bottom surface;
   a stabilization layer including an array of staging cavities corresponding to the array of micro devices, wherein each staging cavity includes sidewalls of the stabilization layer that completely laterally surround at least a portion of a thickness of the device layer of a corresponding micro device; and
   a sacrificial release layer that completely covers a bottom surface forming a lower main surface of each staging cavity, spans along the sidewalls of each cavity, and spans underneath an entirety of the bottom surface of the device layer of the corresponding micro device;
   wherein the array of micro devices is embedded in the sacrificial release layer within the array of staging cavities, wherein the stabilization layer spans directly underneath each micro device.

2. The stabilization structure of claim 1, wherein an embedded portion of each micro device is embedded in the sacrificial release layer within the array of staging cavities, and the embedded portion of each micro device is completely laterally surrounded by the sacrificial release layer.

3. The stabilization structure of claim 2, wherein the sacrificial release layer spans directly over the sidewalls of each of the staging cavities.

4. The stabilization structure of claim 1, wherein the sacrificial release layer comprises an oxide or nitride material.

5. The stabilization structure of claim 1, further comprising a sacrificial cap layer over the array of micro devices and the sidewalls of each of the staging cavities.

6. The stabilization structure of claim 1, wherein the stabilization layer is formed of a thermoset material.

7. The stabilization structure of claim 6, wherein the thermoset material includes benzocyclobutene (BCB).

8. The stabilization structure of claim 1, wherein each micro device has a maximum width of 1 to 100 µm.

9. The stabilization structure of claim 8, wherein each staging cavity has a maximum width of 1 to 100 µm.

10. The stabilization structure of claim 8, wherein each staging cavity has a maximum width between 0.5 µm and 20 µm larger than the maximum width of a corresponding micro device within the staging cavity.

11. The stabilization structure of claim 8, wherein the sidewalls are 0.5 to 20 µm wide.

12. The stabilization structure of claim 1, further comprising a conductive contact on the bottom surface of the device layer of each micro device.

13. The stabilization structure of claim 12, wherein each micro device is a micro LED device.

14. The stabilization structure of claim 13, further comprising a conductive contact on a top surface of each micro LED device.

15. The stabilization structure of claim 12, wherein each micro device is a micro chip.

16. The stabilization structure of claim 15, further comprising a plurality of laterally separate conductive contacts on the bottom surface of the device layer of each micro chip.

17. The stabilization structure of claim 16, wherein at least one of the laterally separate conductive contacts on the bottom surface of the device layer of each micro chip is electrically connected with a landing pad of the respective micro chip.

18. The stabilization structure of claim 12, wherein each conductive contact comprises a diffusion barrier and a bonding layer between the diffusion barrier and the sacrificial release layer.

19. The stabilization structure of claim 1, wherein each staging cavity shares one of the sidewalls with an adjacent staging cavity.

20. The stabilization structure of claim 1, wherein each staging cavity shares sidewalls with a plurality of corresponding adjacent staging cavities.

* * * * *